US009730356B2

(12) United States Patent
Franz et al.

(10) Patent No.: US 9,730,356 B2
(45) Date of Patent: Aug. 8, 2017

(54) LEVER UNIT

(71) Applicant: Hewlett-Packard Development Company, L.P., Houston, TX (US)

(72) Inventors: John P Franz, Houston, TX (US); Michael L Sabotta, Houston, TX (US); David A Moore, Tomball, TX (US); Tahir Cader, Liberty Lake, WA (US); Alan B Doerr, Magnolia, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/901,346

(22) PCT Filed: Jun. 28, 2013

(86) PCT No.: PCT/US2013/048422
§ 371 (c)(1),
(2) Date: Dec. 28, 2015

(87) PCT Pub. No.: WO2014/209334
PCT Pub. Date: Dec. 31, 2014

(65) Prior Publication Data
US 2016/0157376 A1 Jun. 2, 2016

(51) Int. Cl.
*H05K 7/14* (2006.01)
*H05K 7/20* (2006.01)
*G11B 33/12* (2006.01)

(52) U.S. Cl.
CPC ......... *H05K 7/1487* (2013.01); *G11B 33/128* (2013.01); *H05K 7/1404* (2013.01); *H05K 7/1489* (2013.01); *H05K 7/20709* (2013.01)

(58) Field of Classification Search
CPC .. H05K 7/1404; H05K 7/20709; H05K 5/023; H05K 7/16
(Continued)

(56) References Cited

U.S. PATENT DOCUMENTS

| 5,278,730 A | 1/1994 | Kikinis |
| 7,088,589 B2 * | 8/2006 | Chen ................... B60R 11/0235 312/223.1 |

(Continued)

FOREIGN PATENT DOCUMENTS

| DE | 102005037342 | 4/2007 |
| EP | 0699019 | 1/2003 |

(Continued)

OTHER PUBLICATIONS

PCT/ISA/KR, International Search Report, mailed Mar. 27, 2015, PCT/US2013/048422, 10 pps.

(Continued)

*Primary Examiner* — Hoa C Nguyen
*Assistant Examiner* — Keith Depew
(74) *Attorney, Agent, or Firm* — Hewlett Packard Enterprise Patent Department

(57) ABSTRACT

An assembly to connect two electronic components is provided herein. The assembly includes a lever unit with a lever and a base. The lever includes a primary cam member and a secondary cam member connected thereto. The lever also includes a hook member extending therefrom. The base includes a guide structure to engage with a drive pin. Rotation of the lever to move a first electronic component along a y-axis towards, a backplane. The secondary cam member to move the drive pin along the guide structure, and the hook member to engage with a second electronic component and mate the first electronic component and the second electronic component along the second axis.

15 Claims, 15 Drawing Sheets

(58) Field of Classification Search
USPC ......... 16/223, 235, 242, 243, 248, 412, 413, 16/354, 357, 358; 312/223.1
See application file for complete search history.

(56) References Cited

U.S. PATENT DOCUMENTS

| | | | |
|---|---|---|---|
| 7,242,576 B2 | 7/2007 | Coster et al. | |
| 7,961,465 B2* | 6/2011 | Goldrian | G06F 1/20 165/80.4 |
| 8,089,764 B2 | 1/2012 | Attlesey | |
| 8,385,076 B2* | 2/2013 | Peng | H05K 7/1401 248/200 |
| 8,416,563 B2* | 4/2013 | Hou | H05K 7/1489 211/26 |
| 8,435,057 B1* | 5/2013 | Jun | H05K 7/1409 439/157 |
| 8,446,719 B2* | 5/2013 | Nakayama | G06F 1/187 312/223.1 |
| 8,936,477 B1* | 1/2015 | Kerrigan | H01R 13/62961 361/788 |
| 9,063,705 B2* | 6/2015 | Howell | H05K 7/1405 |
| 9,144,178 B2* | 9/2015 | Arvelo | H05K 7/20772 |
| 2006/0023430 A1* | 2/2006 | Karstens | H05K 7/1409 361/732 |
| 2008/0164789 A1* | 7/2008 | Williams | A47B 88/00 312/223.1 |
| 2008/0257100 A1 | 10/2008 | Cho | |
| 2010/0254106 A1* | 10/2010 | Graybill | H05K 7/1489 361/760 |
| 2011/0051326 A1* | 3/2011 | Chen | G06F 1/1679 361/679.01 |
| 2011/0205713 A1 | 8/2011 | Kawada et al. | |
| 2012/0286630 A1 | 11/2012 | Tomizawa | |
| 2015/0181743 A1* | 6/2015 | Skirmont | H05K 7/1409 361/679.58 |
| 2016/0050778 A1* | 2/2016 | Howell | H05K 7/1488 312/215 |

FOREIGN PATENT DOCUMENTS

| | | |
|---|---|---|
| EP | 2505457 | 10/2012 |
| GB | 2102209 A | 1/1983 |
| WO | WO-2012/148393 A1 | 11/2012 |

OTHER PUBLICATIONS

Extended European Search Report dated Feb. 22, 2017 for EP application No. 13888099.2; pp. 7.

* cited by examiner

900

```
┌─────────────────────────────────────┐
│  PROVIDE A LEVER UNIT AND A RAIL UNIT │
│                920                    │
└─────────────────────────────────────┘
                 │
                 ▼
┌─────────────────────────────────────┐
│ ROTATE A LEVER BETWEEN A FIRST ANGULAR │
│  POSITION AND A SECOND ANGULAR POSITION,│
│  ROTATION OF THE LEVER MOVES THE DRIVE PIN│
│  ALONG THE GUIDE STRUCTURE, WHICH MOVES THE│
│     ELECTRONIC COMPONENT FROM A FIRST│
│    LONGITUDINAL POSITION TO A SECOND│
│   LONGITUDINAL POSITION ALONG THE FIRST AXIS│
│                940                    │
└─────────────────────────────────────┘
                 │
                 ▼
┌─────────────────────────────────────┐
│  ROTATE THE LEVER BETWEEN THE SECOND ANGULAR│
│    POSITION AND A THIRD ANGULAR POSITION,│
│   ROTATION OF THE LEVER MOVES THE DRIVE PIN│
│    ALONG THE GUIDE STRUCTURE AND THE HOOK│
│   MEMBER ENGAGES WITH A RAIL UNIT CONNECTED TO│
│    THE SECOND ELECTRONIC COMPONENT, THE HOOK│
│    MEMBER MOVES THE RAIL UNIT ALONG THE FIRST│
│   AXIS BETWEEN A FIRST RAIL POSITION AND A SECOND│
│    RAIL POSITION, MOVEMENT OF THE RAIL UNIT TO│
│   MATE THE FIRST ELECTRONIC COMPONENT AND THE│
│    SECOND ELECTRONIC COMPONENT ALONG THE│
│                SECOND AXIS            │
│                960                    │
└─────────────────────────────────────┘
```

ROTATE A LEVER BETWEEN THE THIRD ANGULAR POSITION AND A SECOND ANGULAR POSITION, ROTATION OF THE LEVER TO MOVE THE DRIVE PIN ALONG THE GUIDE STRUCTURE AND THE REVERSE HOOK MEMBER ENGAGES WITH A RAIL UNIT CONNECTED TO THE SECOND ELECTRONIC COMPONENT, THE REVERSE HOOK MEMBER TO MOVE THE RAIL UNIT ALONG THE FIRST AXIS TO RETURN A SPRING MEMBER TO AN EQUILIBRIUM STATE AND SEPARATE THE FIRST ELECTRONIC COMPONENT AND THE SECOND ELECTRONIC COMPONENT ALONG THE SECOND AXIS
1020

ROTATE THE LEVER BETWEEN THE SECOND ANGULAR POSITION AND A FIRST ANGULAR POSITION, ROTATION OF THE LEVER MOVES THE DRIVE PIN ALONG THE GUIDE STRUCTURE, WHICH MOVES THE ELECTRONIC COMPONENT ALONG THE FIRST AXIS
1040

*Fig. 10*

LEVER UNIT

BACKGROUND

A handle with a simple, single action mechanism is typically used to insert and remove servers from a rack. The simple, single action mechanism enables movement of the server along a single axis to connect the server to the rack. For example, electrical connections may be formed between the server and the backplane.

BRIEF DESCRIPTION OF THE DRAWINGS

Non-limiting examples of the present disclosure are described in the following description, read with reference to the figures attached hereto and do not limit the scope of the claims. In the figures identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIG. 9 illustrates a flow chart of a method to connect a first electronic component and a second electronic component according to an example; and FIG. 10 illustrates a flow chart of a method to disconnect a first electronic component and a second electronic component according to an example.

DETAILED DESCRIPTION

Figure 1:
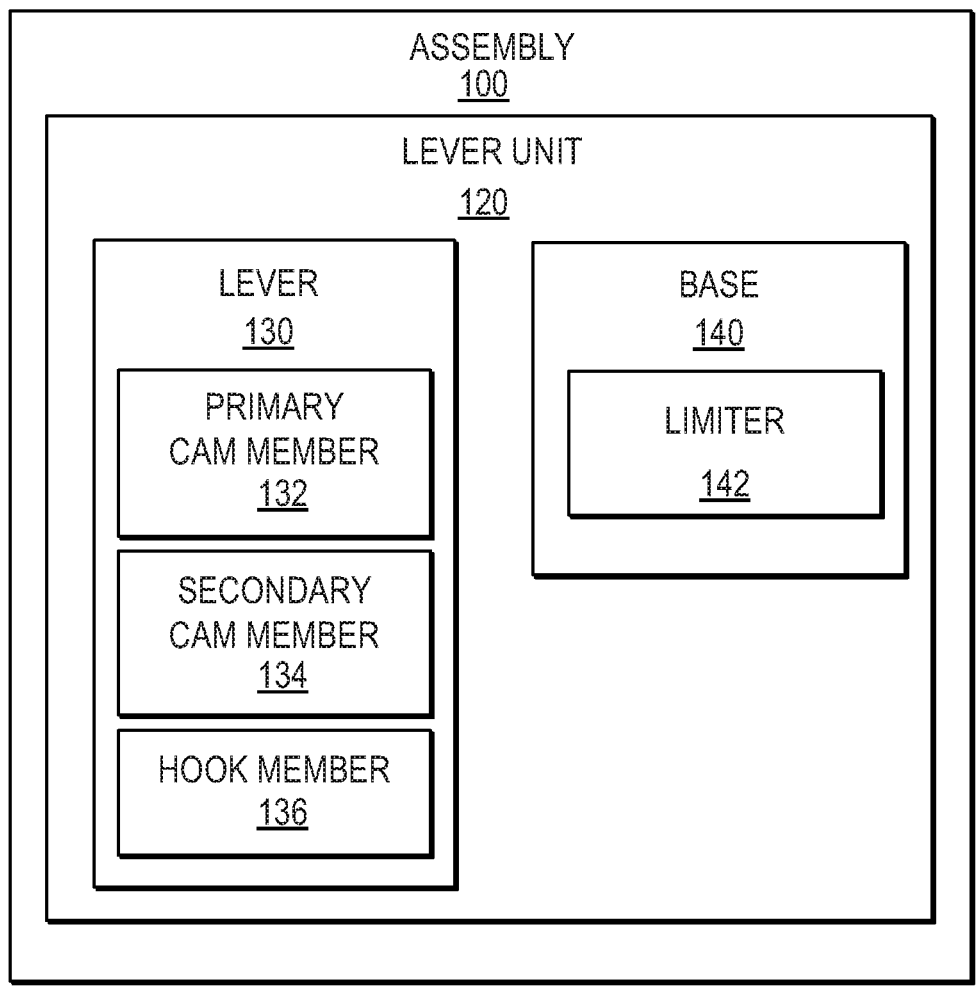
FIG. 1 illustrates a block diagram of an assembly to connect a first electronic component and a second electronic component according to an example.

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Liquid cooling solutions exist but are not common for server equipment. The liquid cooling solutions that exist typically include fluid connections between a server and a cooling device positioned at either the front or rear of the server. For example, the connection may be formed by manual connection of tubes or a blind mate system. The manual connection of tubes and blind mate system work with a server inserted via a handle with a simple, single action mechanism since the server can be inserted and removed in a typical manner. Connection of a dry disconnect liquid cooling system does not work with a handle having a simple, single action mechanism because the server and cooling device form an additional thermal connection that would be disrupted by the insertion and removal of the server. For example, the thermal connection used for a dry disconnect liquid cooling system may be formed adjacent to the electrical connection, such as on a side of the server that is adjacent to the backplane.

The phrase "electronic module" as used herein refers to a computing device, such as a server, a blade server, or a server cartridge that provides computer solutions, storage solutions, network solutions, and/or cloud services.

The phrase "thermal module" as used herein refers to any mechanism to cool or remove heat from the electronic module. The thermal module may also be referred to as a cooling module. A thermal bus bar that collects heat from the electronic module and removes the heat from a server rack is an example of a thermal or cooling module.

The phrase "dry disconnect" as used herein refers to a module assembly with cooling components that cool an electronic module using a liquid cooling method. The liquid cooling method uses a fluid manifold to direct a cooling fluid and a thermal mating member or surface that mates with the electronic module. For example, the thermal mating member may mate with a condenser plate or a heat block formed of a thermally conductive material to receive heat from the electronic module.

The phrase "wet disconnect" as used herein refers to a module assembly with cooling components that cool an electronic module using a liquid cooling method that transfers fluid between the thermal or cooling module and the electronic module using wet or liquid connections that transfer a fluid therethrough.

The phrase "water wall" as used herein refers to a structure formed to distribute the liquid to the wet disconnect connection or the fluid manifold in the dry disconnect. The water wall is typically connected to the rack adjacent to the electronic module.

In examples, an assembly to connect two electronic components is provided. The assembly includes a lever unit that enables the insertion and removal of the server along a first axis and a thermal connection along a second, perpendicular axis. The lever unit includes a lever and a base. The lever includes a primary cam member and a secondary cam member connected thereto. The lever also includes a hook member extending therefrom. The base includes a guide structure to engage with a drive pin. Rotation of the lever to move a first electronic component along a first axis towards a backplane. The secondary cam member to move the drive pin along the guide structure, and the hook member to engage with a second electronic component and mate the first electronic component and the second electronic component along the second axis.

FIG. 1 illustrates a block diagram of an assembly 100 to connect a first electronic component and a second electronic component. The assembly 100 includes a lever unit 120 with a lever 130 and a base 140. The lever 130 includes a primary cam member 132, a secondary cam member 134, and a hook member 136. The base 140 includes a limiter 142.

Figure 2:
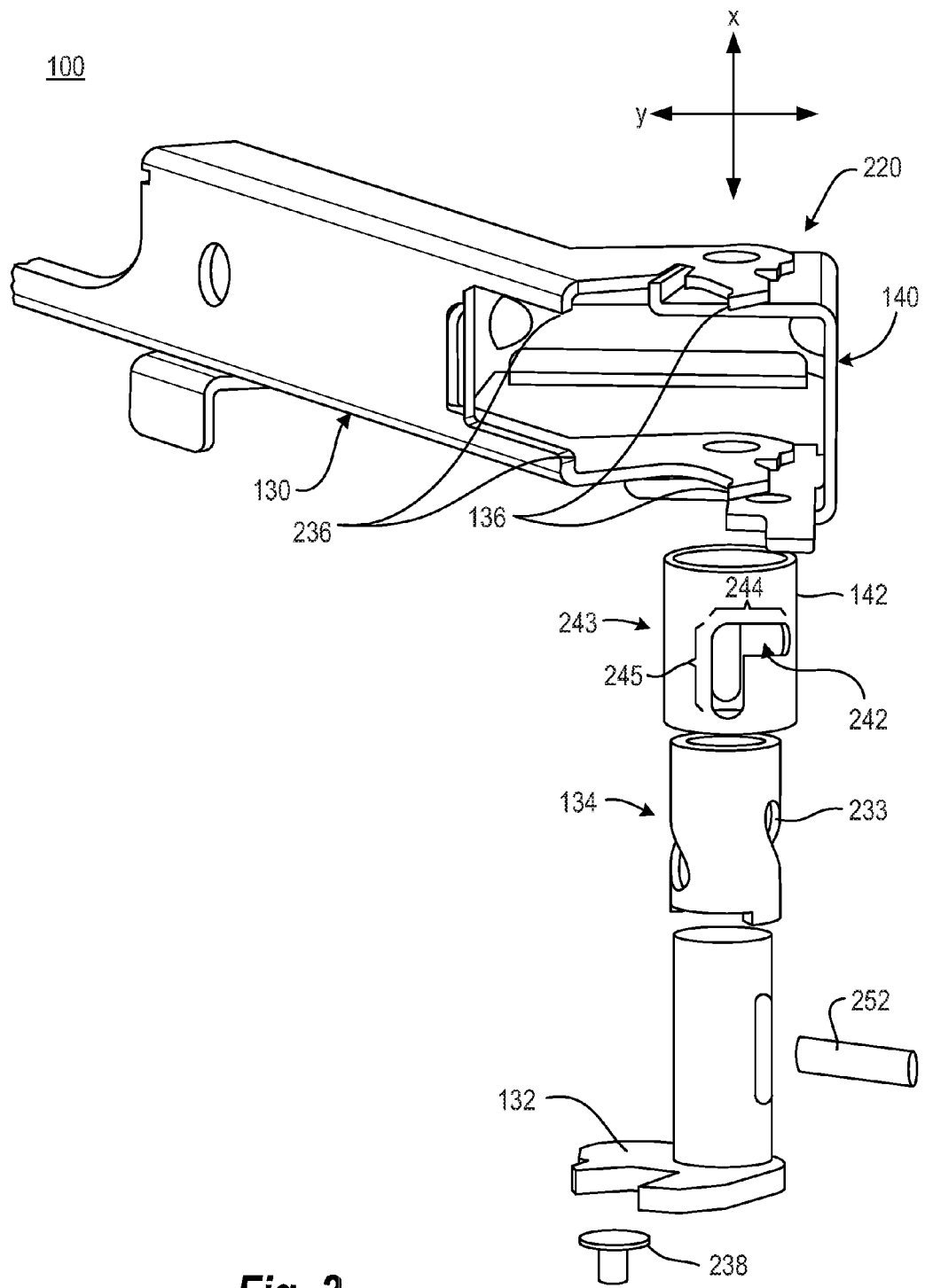
FIG. 2 illustrates an exploded view the assembly of FIG. 1 according to an example.

FIG. 2 illustrates an exploded view of a lever unit of FIG. 1 according to an example. The lever unit 120 of FIG. 2 is referred to as a first lever unit 220. The primary cam member 132 and the secondary cam member 134 are connected to the lever 130. The hook member 136 extends from the lever 130. The primary cam member 132, the secondary cam member 134, and the hook member 136 to rotate with the lever 130.

The primary cam member 132 to engage with a fixed pin 238 to control movement along a first axis, illustrated as the y-axis. The secondary cam member 134 to control movement along a second axis. The second axis illustrated as an x-axis perpendicular to the first axis. The hook member 136 to engage with a second electronic component and mate the first electronic component and the second electronic component along the x-axis. The second electronic component may be a thermal or cooling module, another electronic module, and/or a mechanical device formed to mate with the first electronic module.

The base 140 is connected to a first electronic component, such as an electronic module. For example, the electronic module may include a computing device, such as a server, a blade server, or a server cartridge that provides computer solutions, storage solutions, network solutions, and/or cloud services. The limiter 142 to control movement of the first electronic component along the y-axis. As illustrated in FIG. 2, the limiter 142 includes a guide structure 242 formed in a guide sleeve 243 that is fixed to the base 140. For example, the guide structure 242 includes a first guide track 244 and a second guide track 245 connected at a ninety degree angle. The first and the second guide tracks 244, 245 are formed to receive a drive pin 252. The guide structure 242 to engage with the drive pin 252 as the lever 130 rotates.

Rotation of the lever 130 rotates the primary cam member 132 and moves the drive pin 252 along the guide structure 242. The primary cam member 132 rotates until it engages with a fixed pin 238 and stops rotating. The drive pin 252 moves along the first guide track 244. The rotation of the lever 130 to move the first electronic component along the y-axis towards a backplane.

As the lever 130 continues to rotate, the drive pin 252 continues to move along the second guide track 245 and the hook member 136 continues to rotate. The drive pin 252 moves along the second guide track 245, which is perpendicular to the first guide track 244 to control movement of at least one electronic component selected from the first electronic component and the second electronic component along the x-axis. The hook member 136 engages with a second electronic component to mate the first electronic components and the second electronic components along the x-axis. For example, the hook member 136 to engage with a rail unit to move a portion of the rail unit along the y-axis. Movement of the portion of the rail unit to enables the first electronic component and the second electronic component to mate along the x-axis. An example of the engagement is further illustrated below in FIGS. 4A-4B. The lever 130 may further include a reverse hook member 236 to engage with the rail unit and move a portion of the rail unit along the y-axis in a direction opposite of the hook, member 136.

Figure 3:
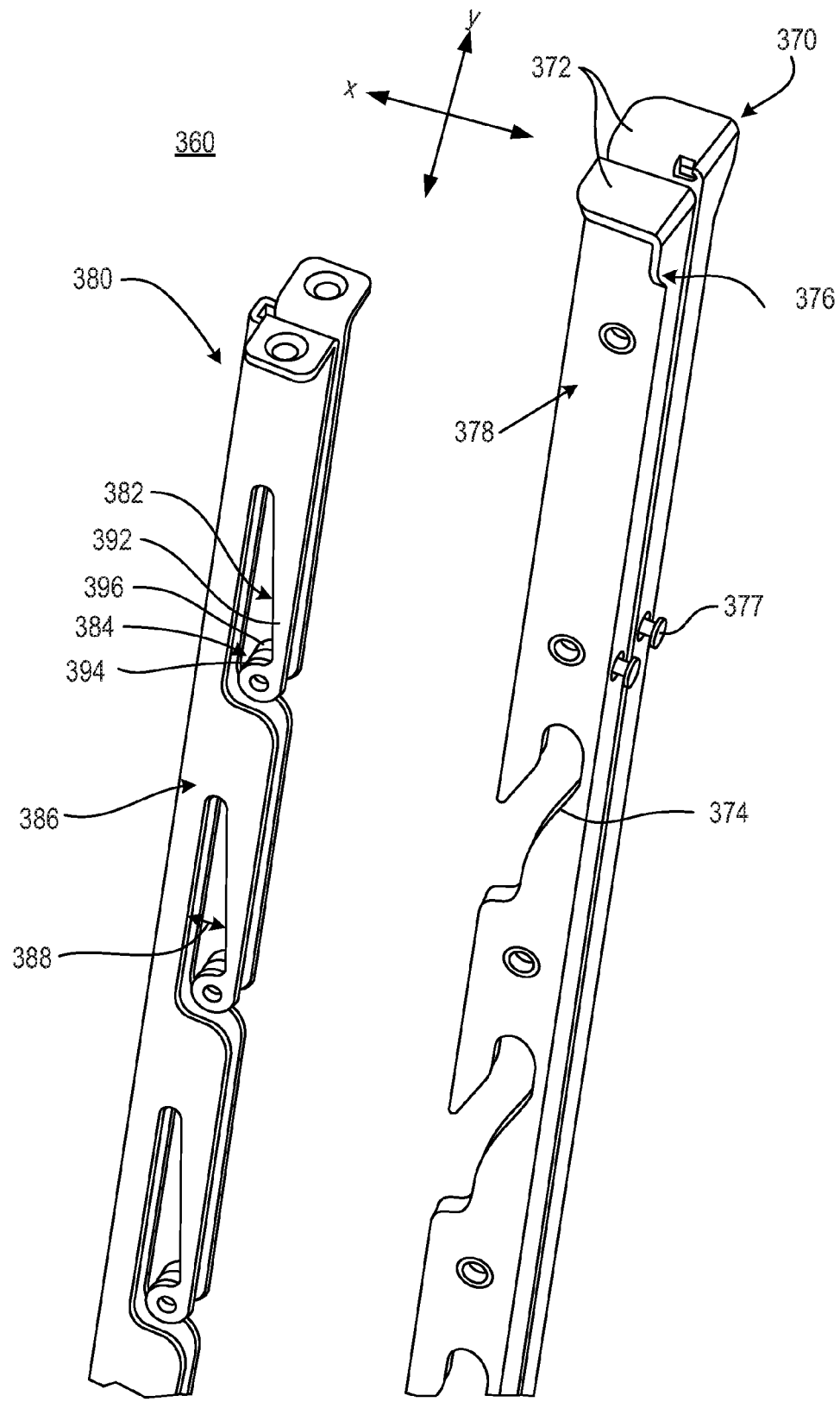
FIG. 3 illustrates an exploded view of a rail unit useable, with the assembly of FIGS. 1-2 according to an example.

FIG. 3 illustrates an exploded view of a rail unit 360 useable with the assembly of FIGS. 1-2 according to an example. The rail unit 360 includes a guide member 370 and an engagement member 380. The guide member 370 includes a flange 372 and a guide rail 374. For example, the guide member 370 includes a planar guide 376 with a guide wall 378 having the guide rail 374 formed therein. The flange 372 extends from the planar guide 376. The flange 372 is illustrated as a T-shaped flange. The hook member 136 to engage with the flange 372 to move the guide rail 374 along the first axis, i.e., the y-axis, The guide member 370 may further include a rack pin 377 that extends from the planar guide 376 and is formed to connect the rail, unit 360 to a rack, i.e., a server rack. For example, the rack pin 377 may be a circular or "o" shaped and the server rack may include a slot formed to receive the rack pin 377 at "o" shaped opening and then enable the movement of the rack pin 377 along the slot, where the slot is smaller than the "o" shaped opening and extends from the "o" shaped opening to hold the rail unit 360 in place.

The engagement member 380 includes a spring member 382 and an engagement mechanism 384. The spring member 382 to control the mating of at least one electronic component selected from the first electronic component and the second electronic component along the second axis, the x-axis. The spring member 382 controls the mating through use of a spring force and provides for tolerance compliance by the movement illustrated through arrow 388. The engagement mechanism 384 connected to the spring member 382. The engagement mechanism 384 to move along the guide rail 374 as the hook member 136 moves the guide rail 374. The movement of the guide rail 374 to displace the rail unit 360 and enable the first electronic component and the second electronic component to mate along the x-axis.

For example, the spring member 382 includes a cantilever spring 392 and the engagement mechanism 384 includes a roller 394 connected to the cantilever spring 392 via a bracket 396 that extends from the engagement member 380. The engagement member 380 may include a planar engagement structure 386. The planar guide 376 may be formed to receive the planar engagement structure 386, such that the planar engagement structure 386 and the planar guide 376 mate and the engagement mechanism 384 and the guide rail 374 engage with one another. Movement of the guide member 370 moves the engagement mechanism 384 such as, the roller 394, along the guide rail 374 and displaces the spring member 382, such as, the cantilever spring 392, to mate the first electronic component and the second electronic component along the second axis. The first lever unit 220 and the rail unit 360 in cooperation, move the engagement mechanism 384 along the guide rail 374 and move of the drive pin 252 along the second guide track 245 to provide movement along the x-axis. The spring member 382 provides a spring force that controls the mating and provides for tolerance compliance to complete the mating of the first electronic component and the second electronic component in a controlled manner.

FIGS. 4A-4E illustrate movement of the assembly of FIG. 1 according to an example. The assembly 100 includes the first lever unit 220 of FIG. 2 and the rail unit 360 of FIG. 3. The first lever unit 220 is connected to the first electronic component, which is illustrated as an electronic module 410. The rail unit 360 is illustrated to include a U-shaped flange 372. The rail unit 360 is connected to the second electronic component, which is illustrated as a thermal module 450. The thermal module 450 illustrated includes a thermal bus bar for a dry disconnect liquid cooling system. The first lever unit 220 is connected to a front corner 712 of the electronic module 410. Adjacent to the first lever unit 220 is a set of condenser plates 420 that are formed to mate with the thermal module 450. For example, in a dry disconnect liquid cooling system, a flat surface of the condenser plate 420 and a flat surface, i.e., a mating surface 422 of the thermal module 450 mate. The flat surfaces of the mating surface 422 and the condenser plate 420 are formed of a thermally conductive material such as copper. The heat from the electronic module 410 is removed therefrom and is transferred to the thermal module 450 using the contact between the flat surfaces, The hook member 136 is illustrated as a bar 436 that extends from the lever 130.

Figure 4A:
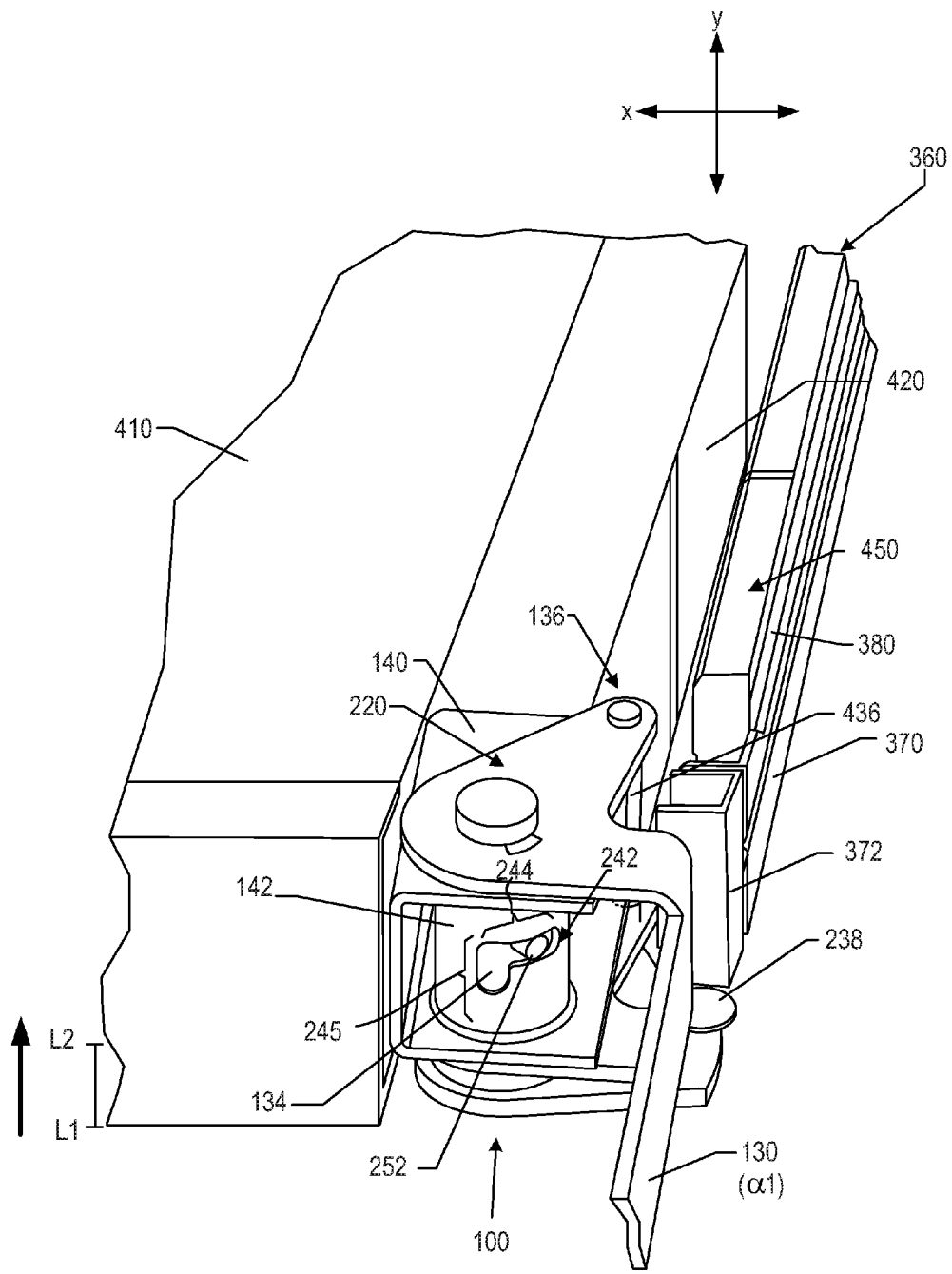
FIGS. 4A-4E illustrate movement of the assembly of FIG. 1 according to an example.
Figure 4B:
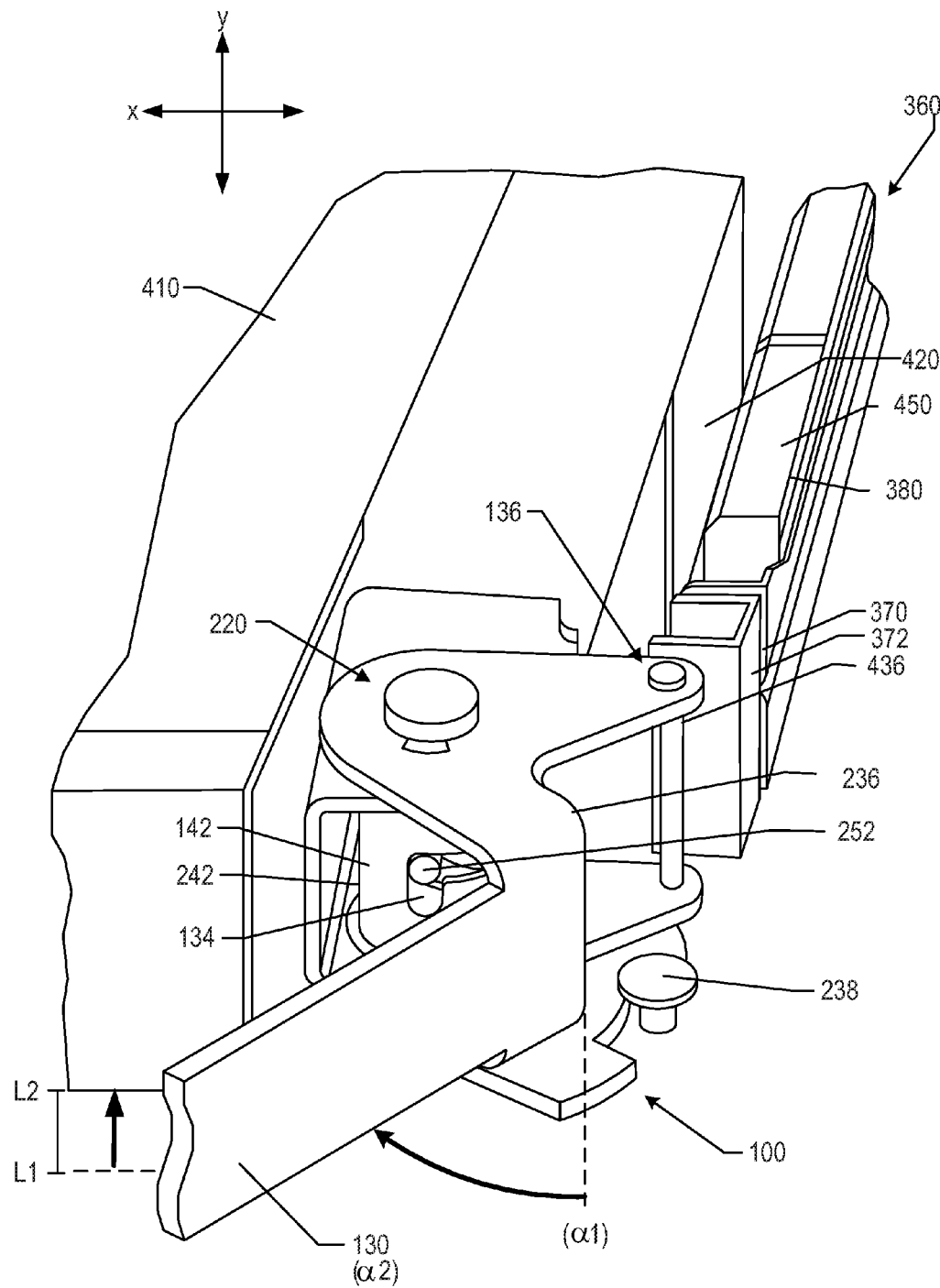
Figure 4C:
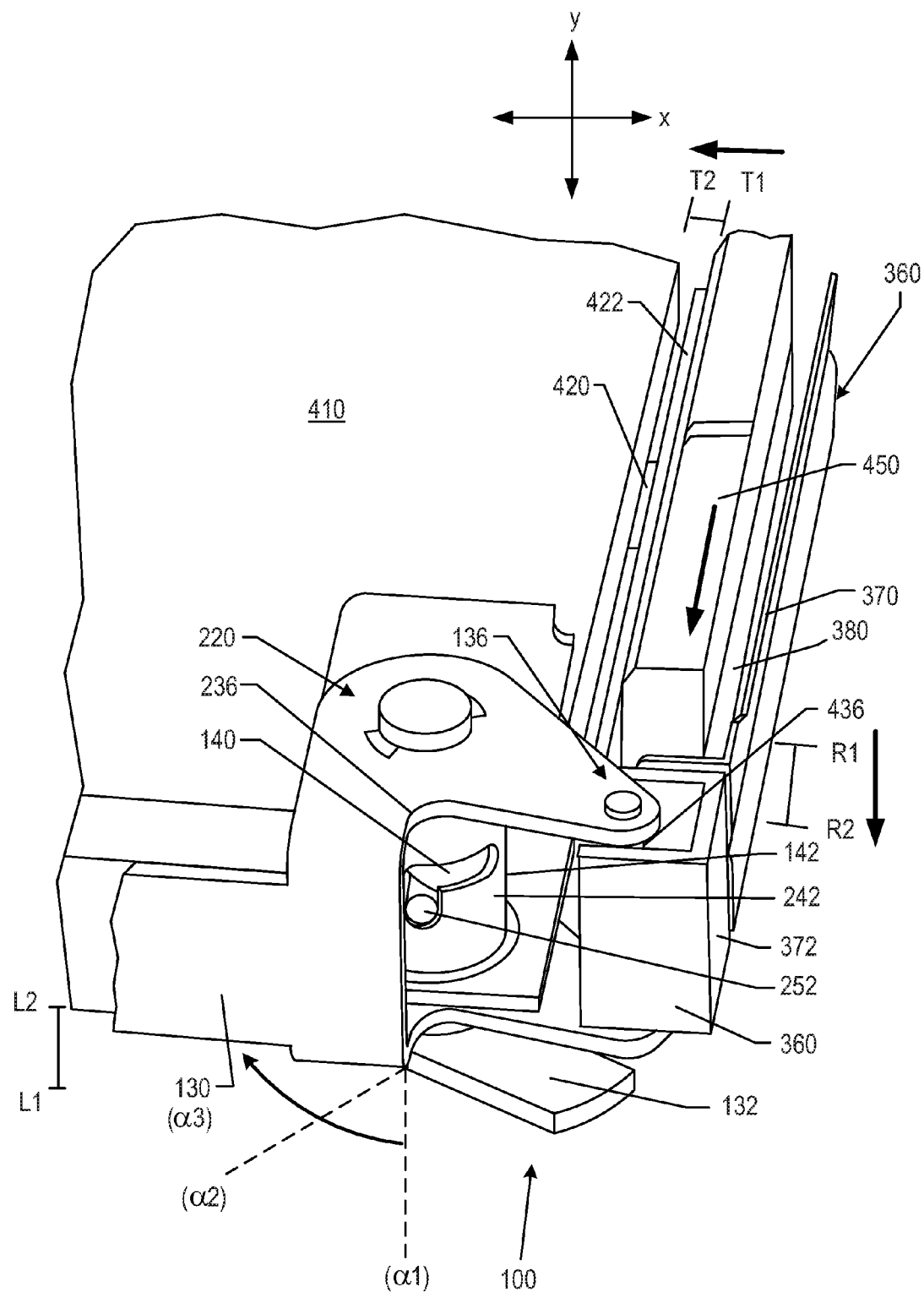

FIGS. 4A-4C illustrate use of the lever unit to insert the electronic module 410 into a rack and form a connection between the electronic module 410 and the thermal module 450. FIG. 4A illustrates the lever 130 in a first angular position, α1. In the first angular position, α1, the fixed pin 238 allows rotation of the primary cam member 132. For example, the primary cam member 132 may not be engaged with fixed pin 238 or may be engaged in a position that allows rotation of the primary cam member 132. The drive pin 252 is positioned in the first guide track 244 and allows movement along the first axis, i.e., the y-axis. The hook member 136 is positioned away from the rail unit 360, such that the hook member 136 and the rail unit 360 are not engaging with one another.

As the lever 130 rotates between a first angular position α1 and a second angular position α2, the drive pin 252 moves along the guide structure 242, as illustrated in FIG. 4B. Movement of the drive pin 252 along the guide structure 242 enables movement of the electronic module 410 from a first longitudinal position L1 to a second longitudinal position L2 along the y-axis. In the second longitudinal position L2, an electrical connection forms between the electronic module 410 and the backplane. The second longitudinal position L2 occurs when the lever 130 is in the second angular position α2. In the second angular position α2, the hook member 136 moves towards the rail unit 360 to engage with the rail unit 360. The drive pin 252 is positioned between the first guide track 244 and the second guide track 245 and allows movement along the x-axis.

As the lever 130 rotates between the second angular position α2 and a third angular position α3, the fixed pin 238 prevents movement of the primary cam member 132, as illustrated in FIG. 48. At the same time, the drive pin 252 moves along the second guide track 245 of the guide structure 242 and allows movement along the x-axis. The hook member 136 engages with the rail, unit 360, for example, the flange 372. The hook member 136 moves or pulls a portion of the rail unit 360, for example, the guide member 370, along the y-axis, between a first rail position R1 and a second rail position R2. Movement of the guide member 370 to displace the rail unit 360 to mate the electronic module 410 and the thermal module 450 along the x-axis.

For example, the guide member 370 and the engagement member 380 mate As the guide member 370 moves, the engagement mechanism 384 engages with the guide rail 374, to displace the rail unit 360 and mate the electronic module 410 and the thermal module 450 along the x-axis. The mating of the electronic module 410 and the thermal module 450 may occur by the thermal module 450 moving towards the electronic module 410 and/or the electronic module 410 moving towards the thermal module 450

The assembly 100 may use the spring member 282 to control the mating, for example, control movement the last three millimeters and maintain a thermal connection therebetween using a spring force. After the electronic module 410 and the thermal module 450 mate or are in a mating position, the rotation of the lever 130 moves the spring member 382 from an equilibrium position to a displaced position. Displacement of the spring member 382 to maintain the mating of the electronic module 410 and the thermal module 450 along the x-axis using a calculated spring force, which maintains the thermal connection therebetween. When the lever 130 is in the third angular position α3, the drive pin 252 is positioned in the second guide track 245 and the hook member 136 is engaged with the guide member 370, as illustrated in FIG. 4C.

Figure 4D:
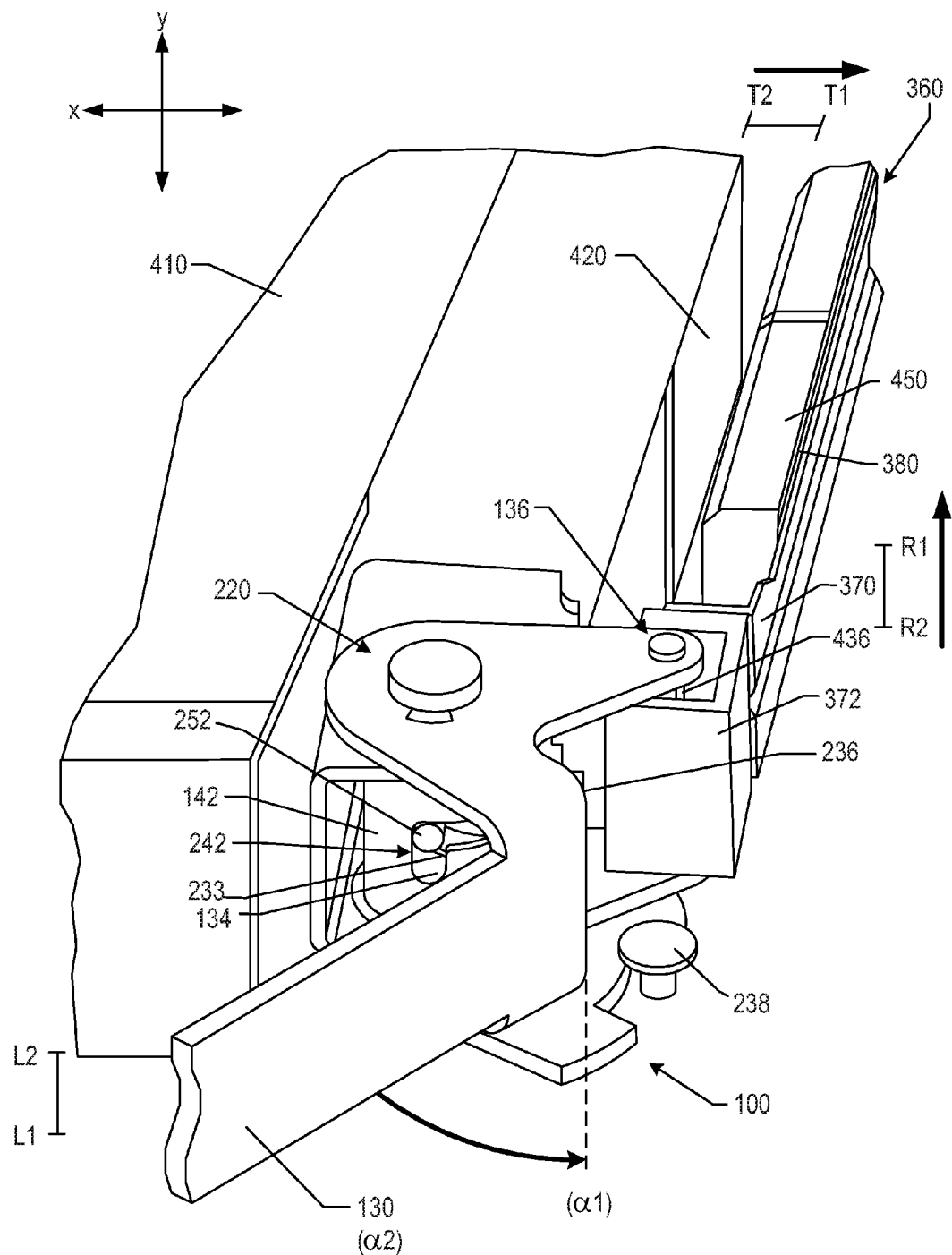
Figure 4E:
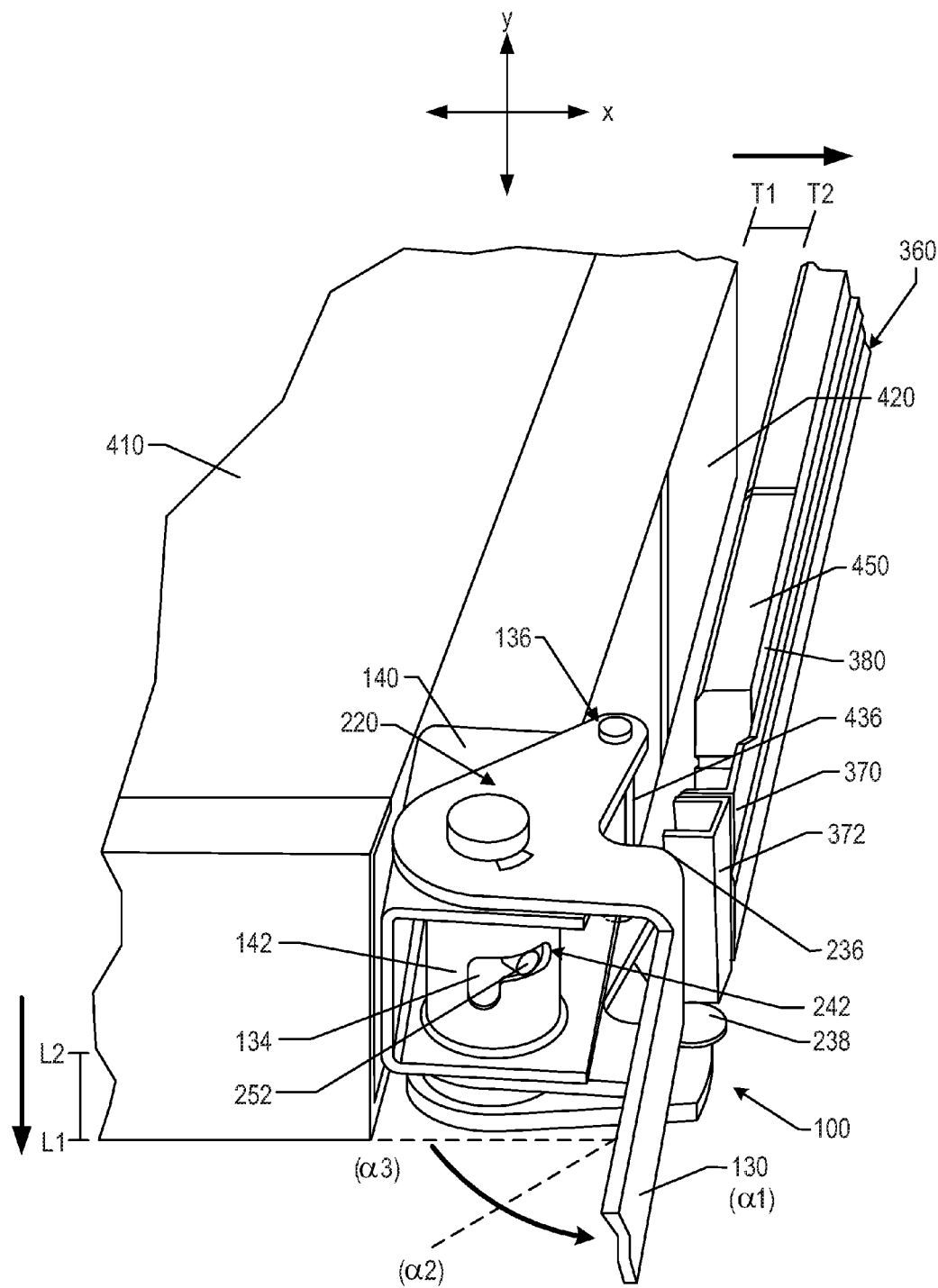

FIGS. 4D-4E illustrate use of the first lever unit 220 to remove the thermal connection between the electronic module 410 and the thermal module 450 and remove the electronic module 410 from the rack. As illustrated in FIG. 4C, the electronic module 410 and the thermal module 450 are thermally connected. The lever 130 is in the third angular position α3, the drive pin 252 is positioned In the second guide track 245, and the hook member 136 is engaged with the guide member 370.

As the lever 130 rotates between the third angular position α3 and the second angular position α2, the fixed pin 238 prevents movement of the primary cam member 132. At the same time, the drive pin 252 moves along the second guide track 245 of the guide structure 242 towards the first guide track 244 and allows movement along the x-axis. A reverse hook member 236 engages with the rail unit 360, for example, the flange 372. The reverse hook member 236 moves or pushes a portion of the rail unit 360, for example, the guide member 370, along the y-axis, between the second rail position R2 and the first rail position R1. Movement of the rail unit 360 to move a spring member 382 back to an equilibrium state and to separate the mating of the electronic module 410 and the thermal module 450 along the x-axis, as illustrated in FIG. 4D.

As the lever 130 rotates between the second angular position α2 and the first angular position α1, the drive pin 252 moves along the guide structure 242. Movement of the drive pin 252 along the guide structure 242 allows movement of the electronic module 410 from the second longitudinal position L2 to the first longitudinal position L1 along the y-axis. FIG. 4E illustrates the lever 130 in a first angular position, α1. In the first angular position, α1, the fixed pin 238 is not engaged with the primary cam member 132 and allows rotation of the primary cam member 132. The drive pin 252 is positioned in the first guide track 244 and allows movement along the y-axis. The hook member 136 is positioned away from the rail unit 360, such that the hook member 136 and the rail unit 360 are not engaging with one another. In the first longitudinal position L1, the electrical connection between the electronic module 410 and the backplane is disconnected. The electronic module 410 may then be safely removed from the rack.

Figure 5A:
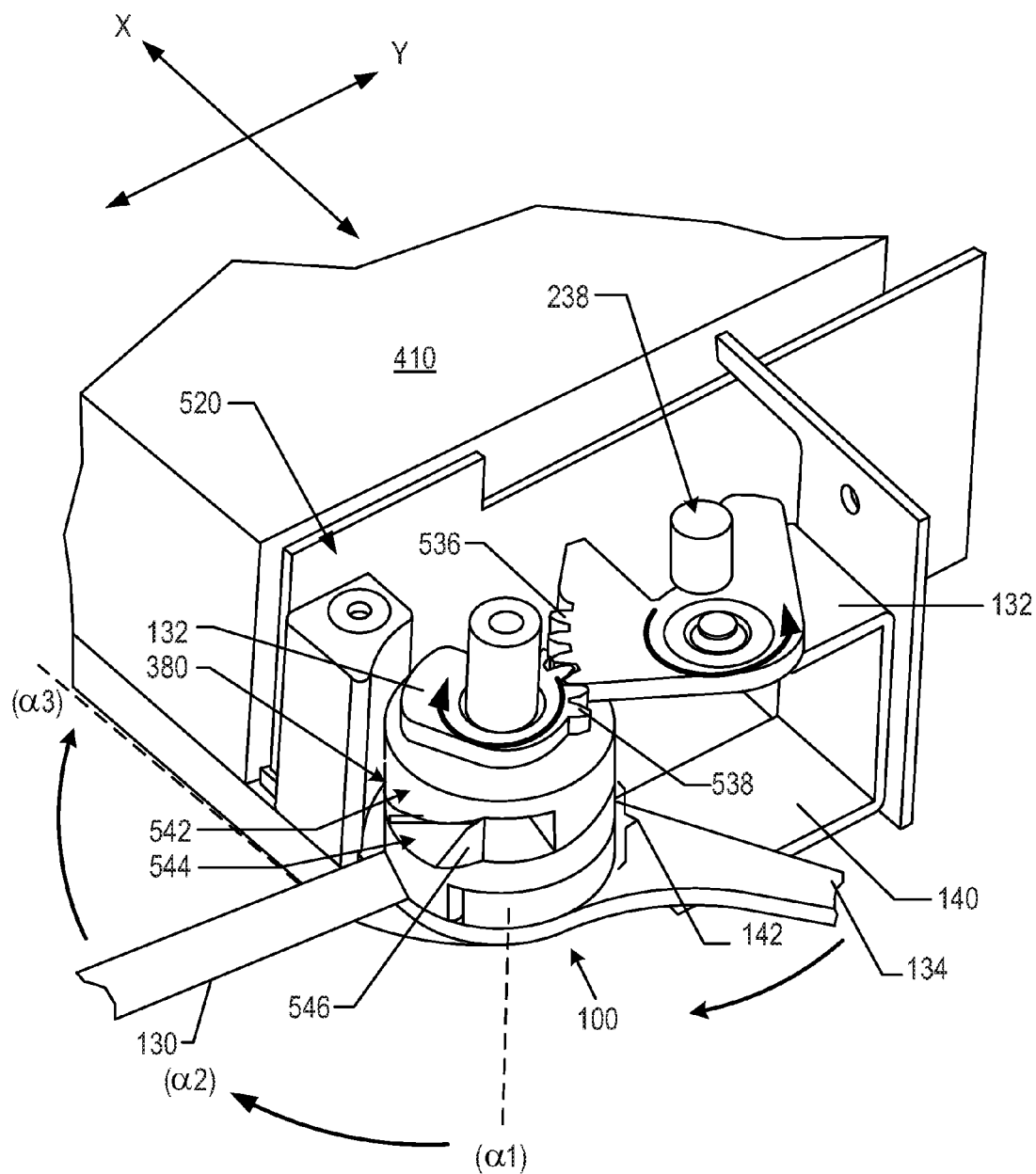
FIGS. 5A-5B illustrate a perspective view of a portion of the assembly of FIG. 1 according to a further example.
Figure 5B:
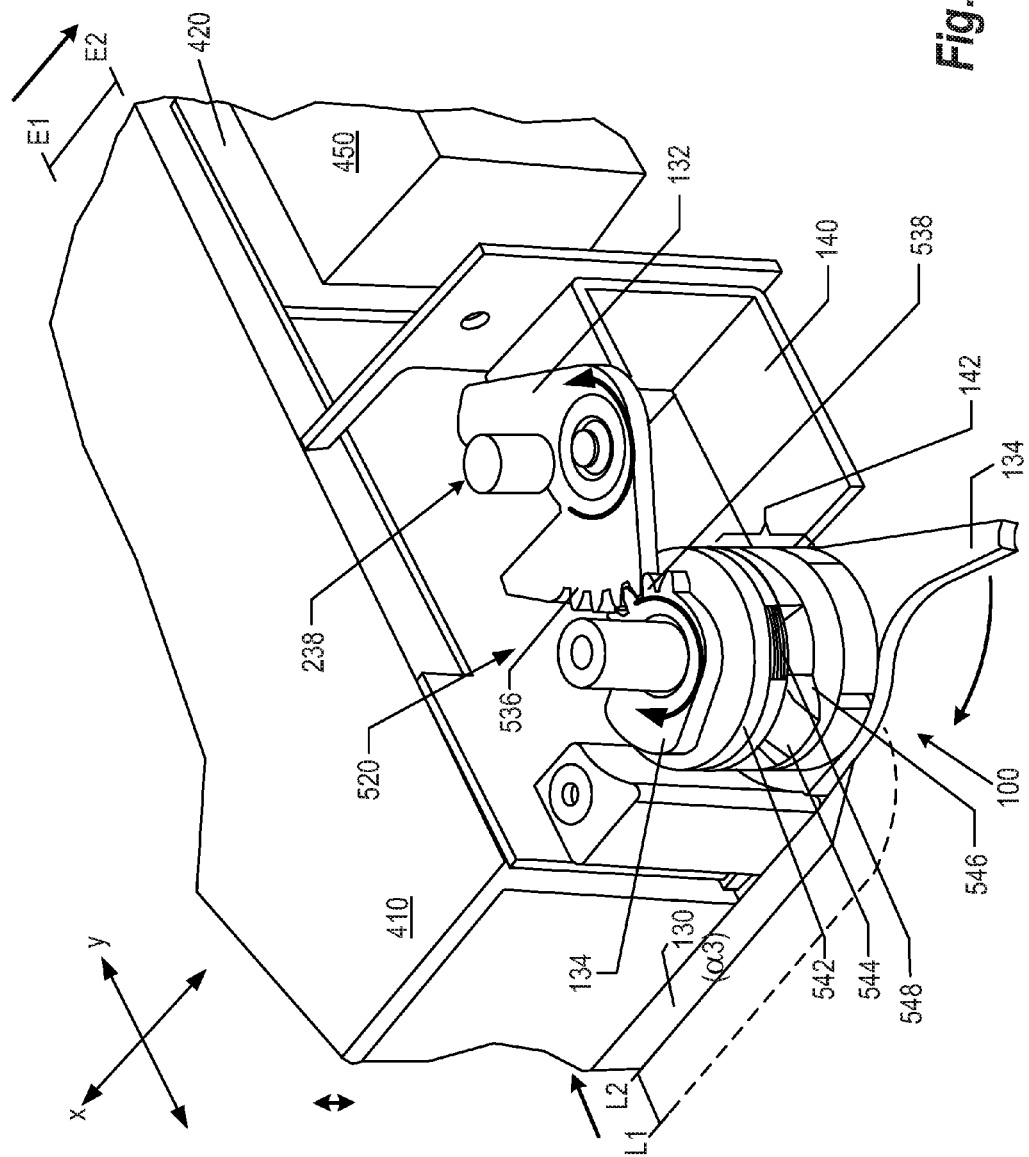

FIGS. 5A-5B illustrates a perspective view of a portion of the assembly of FIG. 1 according to a further example. The assembly includes a second lever unit 520 with a lever 130 and the base 140. The lever 130 includes a primary cam member 132, a secondary cam member 134 and a hook member 136 that rotate with the lever 130. The base 140 is connected to the first electronic component, such as an electronic module 410. The base 140 includes a limiter 142 to control movement of the first electronic component along a first axis, such as the y-axis. Rotation of the lever 130 to move the electronic module 410 along the first axis, i.e., the y-axis, towards a backplane until the primary cam member 132 engages with a fixed pin 238 and stops rotating as the lever 130 moves from the first angular position, α1, to the second angular position, α2, as illustrated in FIG. 5A. For example, the primary cam member 132 and the secondary cam member 134 each contain a gear member, such as a primary gear member 536 and a secondary gear member 538. The primary gear member 536 and the secondary gear member 538 to engage with one another such that the rotation of the lever 130 rotates the secondary gear member 538 and in turn rotates the prima gear member 536 when the primary cam members 132 movement is not restricted by the fixed pin 238.

The secondary cam member 134 includes a limiter 142 connected thereto to control movement along a second axis, for example, an x-axis perpendicular to the first axis or y-axis. The lever 130 further includes a pair of clutch plates 542, 544 connected thereto with the limiter spring 548 formed therebetween. The limiter spring 548 to provide a mating force between the pair of clutch plates 542, 544. The limiter spring 548 to disengage the mating force between the pair of clutch plates 542, 544. When the mating force is disengaged, a ramp 546 on one of the clutch plates 544 enables rotation the pair of clutch plates 542, 544 which slip over the ramp 546. By disengaging the mating force, the rotation of the lever 130 between the second angular position, α2, and the third angular position α3, enables the hook member(s) 136 to engage with the second electronic component, as illustrated in FIG. 5B. The engagement of the hook member 136 and the second electronic component to transfer movement from the y-axis to the x-axis.

Figure 6:
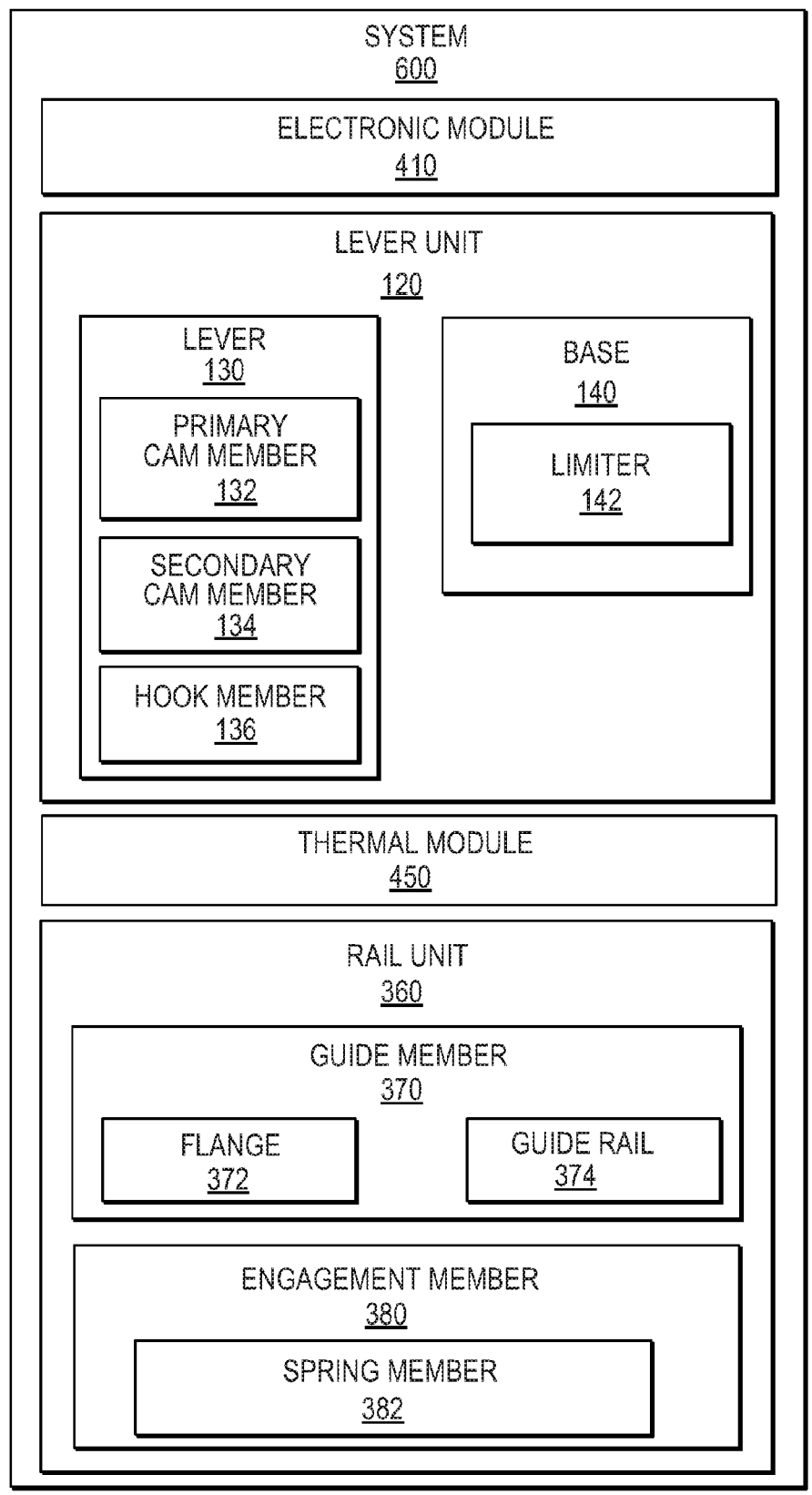
FIG. 6 illustrates a block diagram of a system to connect an electronic module and a thermal module according to an example.

FIG. 6 illustrates a block diagram of a system 600 to connect an electronic module 410 and a thermal module 450 according to an example. The system 600 includes the electronic module 410, a lever unit 120, the thermal module 450, and a rail unit 360. The electronic module 410 to perform computing operations. The thermal module 450 to remove heat from the electronic module 410.

The lever unit 120 includes a lever 130 and a base 140. The lever 130 includes a Primary cam member 132 and a secondary cam member 134 connected to the lever 130 and a hook member 136 extending from the lever 130. The primary cam member 132, the secondary cam member 134, and the hook member 136 to rotate with the lever 130.

The base 140 is connected to the electronic module 410. The base 140 includes a limiter 142. For example, the limiter 142 may include a guide structure 242 to engage with a drive pin 252. The lever unit 120 to move the electronic module 410 along a first axis, such as the y-axis, towards a backplane to form an electrical connection therebetween. For example, as the lever 130 rotates the first electronic component moves along the first axis, i.e., the y-axis, towards a backplane until a fixed pin 238 restricts rotation of the primary cam member 132. The secondary cam member 134 to move the drive pin 252 along the guide structure 242. The movement of the secondary cam 134 and the drive pin 252 controlled by the rotation of the lever 130. The hook member 136 to engage with a second electronic component and mate the first electronic component and the second electronic component along the second axis, i.e., the x-axis.

The rail unit 360 includes a guide member 370 and an engagement member 380. The guide member 370 includes a flange 372 and a guide rail 374. For example, the guide member 370 includes a planar guide 376 with the guide rail 374 formed therein and a flange 372 extending from the planar guide 376. The hook member 136 of the lever unit 120 to engage with the flange 372 to move the guide rail 374 along the first axis, i.e., the y-axis.

The spring member 382 to control the mating of at least one electronic component selected from the electronic module 410 and the thermal module 450 along a second axis, such as the x-axis. The spring member 382 controls the mating using a spring force that provides tolerance compliance, The engagement member 380 to move along the guide rail 374. The movement of the guide rail 374 to displace the rail unit 360 and enable the first electronic component and the second electronic component to mate along the second axis, i.e., the x-axis, and to form a thermal connection therebetween.

The rail unit 360 may further include an engagement mechanism 384 to connect to the spring member 382. The engagement mechanism 364 to engage with and move along the guide rail 374 as the lever 130 rotates. For example, the engagement, mechanism 384 includes two brackets 396 with the spring member 382 formed therebetween. The spring member 382 to provide a mating force between the engagement member 380 and the guide member 370. Movement of the guide rail 374 displaces the spring member 382 to enable movement along the second axis, the x-axis.

The hook member 136 rotates with the lever 130. The hook member 136 to engage with the flange 372 to move the rail unit 350 along the y-axis. Movement of the rail unit 350 mates the thermal module 450 and the electronic module 410 along the x-axis and to form a thermal connection therebetween.

Figure 7:
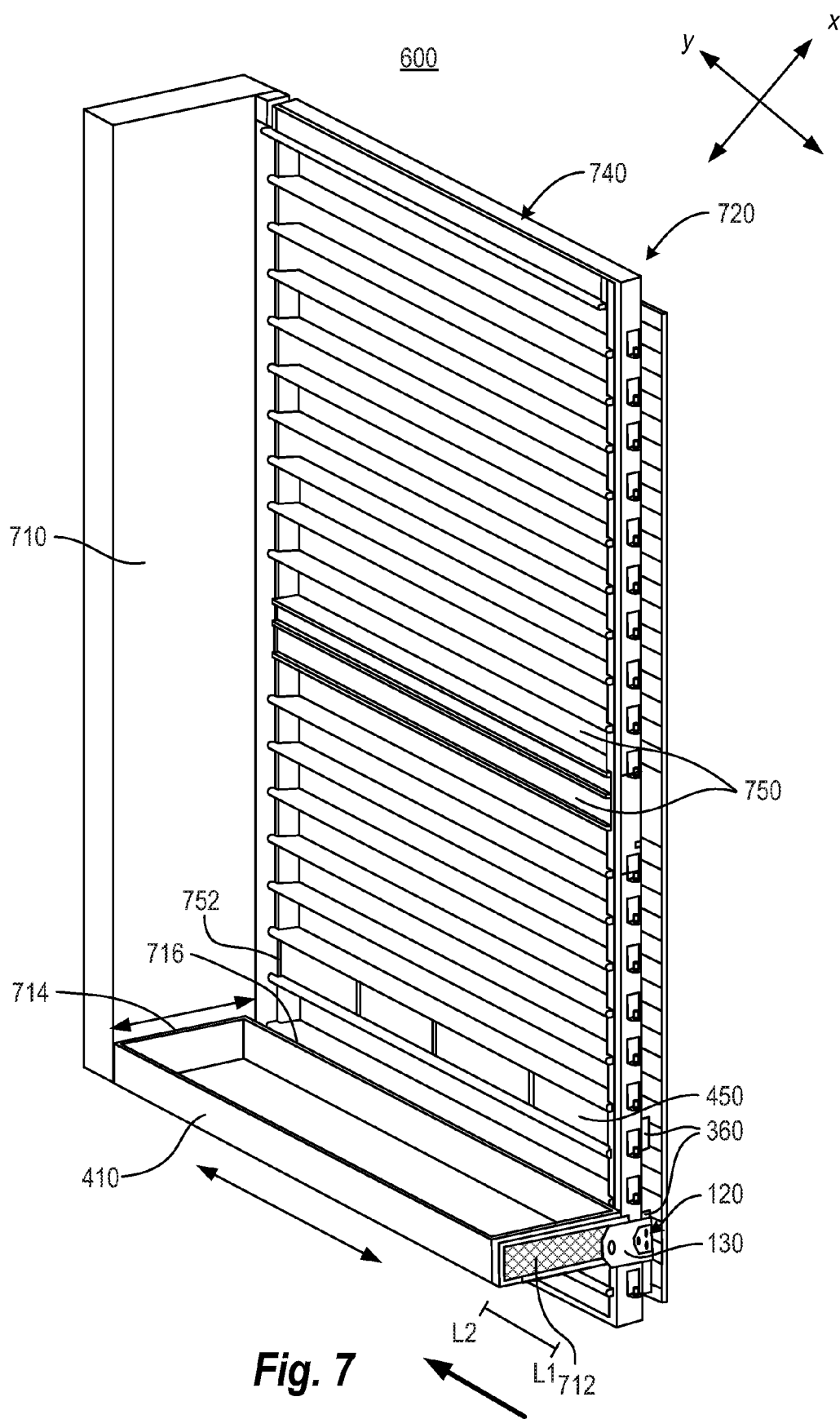
FIG. 7 illustrates a schematic diagram of a portion of the system of FIG. 6 according to an example.

FIG. 7 illustrates a schematic diagram of a portion of the system of FIG. 6 according to an example. The system 600 illustrates a server rack 720 with a water wall 740. The water wall 740 illustrated includes twenty thermal slots 750 each formed to receive a thermal module 450, such as a thermal bus bar 752 for cooling via a dry disconnect liquid cooling system or a water wall for cooling via a wet disconnect liquid cooling system. As illustrated, the thermal module 450 includes a rail unit 360 connected to three of the thermal slots 750 and an electronic module 410 attached to one of the thermal slots 750. The rail unit 360 is attached to the server rack 720 using for example, the rack pin 377 of FIG. 3 and the slot as described above with reference to FIG, 3. The electronic module 410 is electrically connected to the backplane and thermally connected to the thermal module 450. The positioning of the thermal module 450 and the electronic module 410 is accomplished using the assembly 100 and method described herein.

Figure 8:
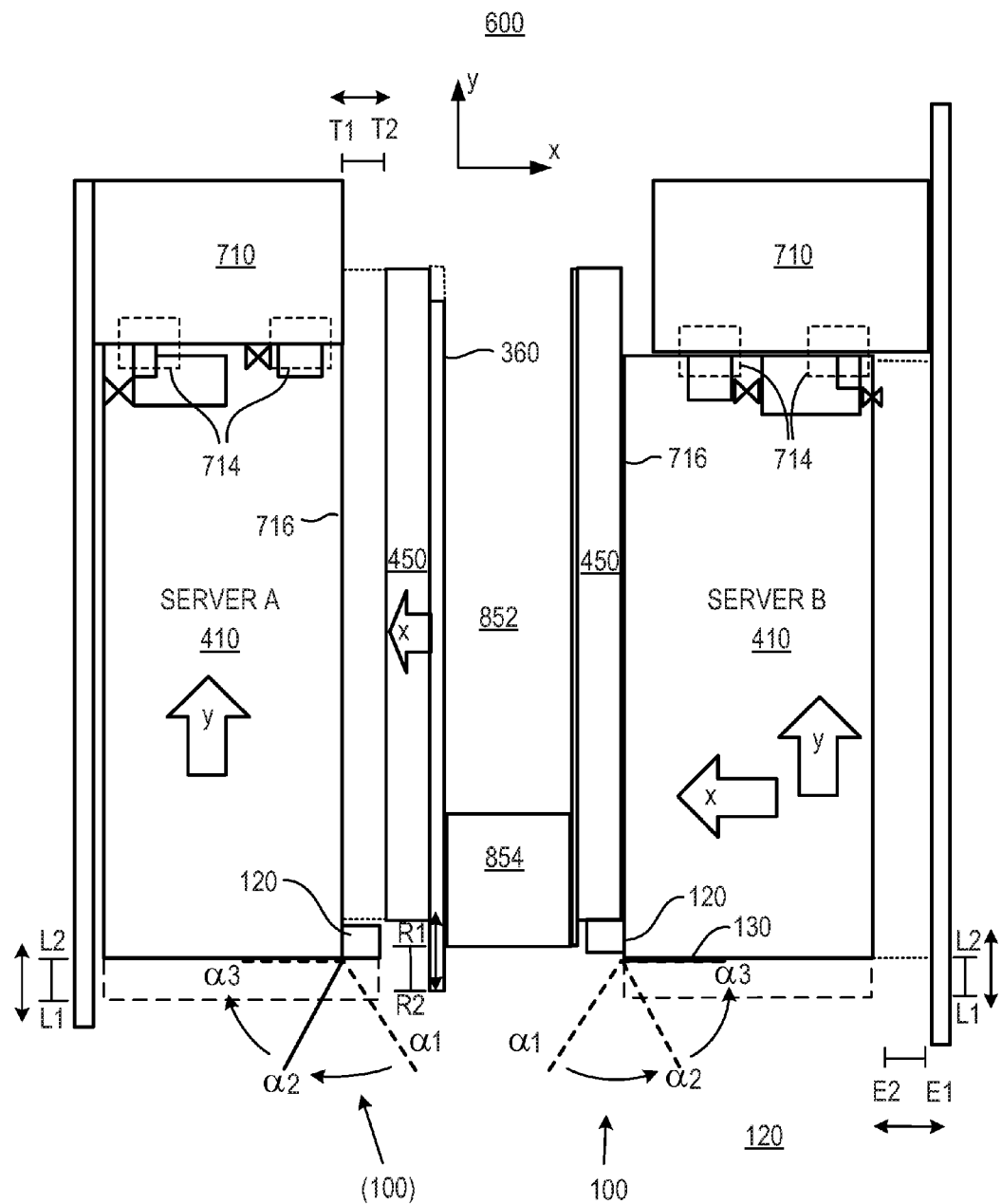
FIG. 8 illustrates a schematic diagram of portion of the system of FIG. 6 according to an example.

For example, FIG. 8 illustrates a schematic diagram of the system 600 of FIG. 6 according to an example. FIG. 8 illustrates, a top cross-sectional view of two electronic modules 410 and two thermal assemblies 450 with wheat exchanger 852 and a set of fans 854 therebetween. The view illustrates the lever 130 in two different positions and variations in the functioning of the lever unit 120. In both examples, the lever unit 120 connects to the electronic module 410.

Referring to the first lever unit 220 which is connected to the electronic module 410, labeled Server A. The rail unit 360 connects to the thermal module 450. The thermal module 450 moves towards the electronic module 410 to mate using the first lever unit 220. The mating is accomplished by rotating the lever 130.

FIG. 8 illustrates the lever 130 in a first angular position, α1 as a dotted line. Referring back to FIGS. 4A-C, in the first angular position, α1, the fixed pin 238 is not engaged with the primary cam member 132 and allows rotation of the primary cam member 132. The drive pin 252 is positioned in the first guide track 244 and allows movement along the first axis, i.e., the y-axis. The hook member 136 is positioned away from the rail unit 360, such that the hook member 136 and the rail unit 360 are not engaging with one another.

As the lever 130 rotates between a first angular position of and a second angular position α2, the drive in 252 moves along the guide structure 242, as illustrated above in FIGS. 4A-4B. Movement of the drive pin 252 along the guide structure 242 enables movement of the electronic module 410 from a first longitudinal position L1 to a second longitudinal position L2 along the y-axis. In the second longitudinal position L2, an electrical connection 714 forms between the electronic module 410 and the backplane 710. The second longitudinal position L2 occurs when the lever 130 is in the second angular position α2. For example, the second angular position α2 may displace the lever 130 ninety degrees from the first angular position α1. In the second angular position α2, the hook member 136 moves towards the rail unit 360 to engage with the rail unit 360. The drive pin 252 is positioned between the first guide track 244 and the second guide track 244 and allows movement along the x-axis, also illustrated above in FIG. 4B.

As the lever 130 rotates between the second angular position α2 and a third angular position α3, the fixed pin 238 prevents movement of the primary cam member 132, as illustrated above in FIG. 4B. At the same time the drive pin 252 moves along the second guide track 245 of the guide structure 242 and allows movement along the x-axis. The hook member 136 engages with the rail unit 360, for example, the flange 372. The hook member 136 moves a portion of the rail unit 360, for example, the guide member 370, along the y-axis, between a first rail position R1 and a second rail position R2. When the lever 130 is in the third angular position α3, the drive pin 252 is positioned in the second guide track 245 and the hook member 136 is engaged with the guide member 370, as illustrated above in FIG. 4C.

Movement of the guide member 370 to displace the rail unit 360 to mate the electronic module 410 and the thermal module 450 along the x-axis and move between a first thermal position T1 and a second thermal position T2 on the x-axis. For example, the guide member 370 and the engagement member 380 mate. As the guide member 370 moves, the engagement mechanism 384 engages with the guide rail 374 to displace the rail unit 360 and mate the electronic module 410 and the thermal module 450 along the x-axis. The spring member 282 may then be used to control the mating, for example, control movement the last three millimeters and maintain a thermal connection 716 therebetween using a spring force. The thermal connection 716 is illustrated in FIG. 4C. The mating of the electronic module 410 and the thermal module 450 in Server A occurs by the thermal module 450 moving towards the electronic module 410.

In the third angular position α3, the first lever unit 220 holds the electronic module 410 and the thermal module 450 in an electronically and thermally engaged state such that the electronic module 410 and the thermal module 450 are operational. FIG. 8 illustrates the motion of the lever 130. For example, the third angular position α3 may displace the lever 130 one hundred and thirty-five degrees from the first angular position α1 and forty five degrees from the second angular position α2.

Referring to the second lever unit 520 which is connected to the second electronic module 410, labeled Server B. The electronic module 410 moves towards the thermal module 450 to mate. The mating is accomplished using the lever 130.

The assembly includes the second lever unit 520 with a lever 130 and the base 140 The lever 130 includes a primary cam member 132, a secondary cam member 134, and a hook member 136 that rotate with the lever 130. The base 140 is connected to the first electronic component, such as an electronic module 410. The base 140 includes a limiter 142 to control movement of the first electronic component along a first axis, such as the y-axis.

Rotation of the lever 130 to move the electronic module 410 along the i.e., the y-axis, towards a backplane 710 until the primary cam member 132 engages with a fixed pin 238 and stops rotating, as illustrated above in FIG. 5A. Rotation between the first angular position α1 and a second angular position α2, moves the electronic module 410 from a first longitudinal position L1 to a second longitudinal position L2 along the y-axis. For example, the primary cam member 132 and the secondary cam member 134 each contain a gear member. The primary gear member 536 and the secondary gear member 538 to engage with one another such that the rotation of the lever 130 rotates the secondary gear member 538 and in turn rotates the primary gear member 536 when the primary cam member's 132 movement is not restricted by the fixed pin 238.

In the second longitudinal position L2, an electrical connection 714 forms between the electronic module 410 and the backplane 710. The second longitudinal position L2 occurs when the lever 130 is in the second angular position α2. For example, the second angular position α2 may displace the lever 130 thirty degrees from the first angular position α1.

As the lever 130 rotates between the second angular position α2 and a third angular position α3, the electronic module 410 moves toward the thermal module 450. For example, the electronic module 410 moves between a first electronic position E1 and a second electronic position E2 along the x-axis. The limiter 142 connected to the secondary cam member 134 to control movement along the x-axis. The limiter spring 648 between the pair of clutch plates 542, 544 to provide a mating force between the pair of clutch plates 542, 544. The limiter spring 548 to disengage the mating force between the pair of clutch plates 642, 544 as the lever 130 rotates between the second angular position α2 and a third angular position α3.

When the mating force is disengaged, a ramp 546 on one of the clutch plates 544 enables rotation the pair of clutch plates 542, 544 which slip over the ramp 546 By disengaging the mating force, the rotation of the lever 130 enables the hook member(s) 136 to engage with the thermal module 450, as illustrated above in FIG. 5B. The hook member 136, which may include at least one hook member, to connect with the thermal module 450. The engagement of the hook member 136 and the thermal module 450 to transfer movement from the y-axis to the x-axis. The hook, member 136 to engage with the thermal module 450 and pull or move the electronic module 410 towards the thermal module 450.

In the third angular position α3, the second lever unit 520 holds the electronic module 410 and the thermal module 450 in an electronically and thermally engaged state such that the electronic module 410 and the thermal module 450 are operational. FIG. 8 illustrates the motion of the, lever 130. For example, the third angular position α3 may displace the lever 130 one hundred and twenty degrees from the first angular position al and ninety degrees from the second angular position α2.

FIG. 9 illustrates a flow chart 900 of a method to connect a first electronic component and a second electronic component according to an example. Block 920 provides a lever unit and a rail unit to engage with one another. The lever unit includes a lever and a base. The lever includes a primary cam member, a secondary cam member, and a hook member. The primary cam member and the secondary cam member are connected to the lever. The hook member extends from the lever. The primary cam member, the secondary cam member, and the hook member to rotate with the lever.

The base is connected to a first electronic component. The base includes a guide structure formed to receive and engage with a drive pin. The drive pin to move along the guide structure. The rail unit includes a guide member and an engagement member. The guide member includes a flange and a guide rail. The hook member to engage with the flange to move the guide rail along a y-axis. The engagement member includes a spring member. The spring member to control the mating of at least one electronic component selected from the first electronic component and the second electronic component along the second axis, i.e., the x-axis using a spring force. The engagement member to move along the guide rail. Movement of the guide rail to displace the rail unit and enable the first electronic component and the second electronic component to mate along the x-axis. The spring member to maintain the mating of the first electronic component and the second electronic component using a spring force that provides for tolerance compliance. The engagement member may further include an engagement mechanism. The engagement mechanism connected to the spring member. The engagement mechanism to engage with and move along the guide rail as the rail unit moves.

The lever rotates between a first angular position and a second angular position in block 940. The rotation of the lever moves the drive pin along the guide structure, which moves the first electronic component from a first longitudinal position to a second longitudinal position along the first axis, i.e., the y-axis. For example, the first electronic component moves along the y-axis towards a backplane. The engagement of the fixed pin and the primary cam member prevents further movement of the electronic component along the first axis, i.e., the y-axis. For example, the primary cam member stops rotating when the lever moves past the second angular position.

In block 960, the lever rotates between the second angular position and a third angular position. The rotation of the lever moves the drive pin along the guide structure and the hook member engages with a rail unit connected to the second electronic component. The hook member moves the rail unit along the first axis, i.e., the y-axis between a first rail position and a second rail position. For example, the hook member engages with the flange to move the rail unit along the y-axis. The movement of the rail unit to mate the first electronic component and the second electronic component along the second axis, i.e., the x-axis.

FIG. 10 illustrates a flow chart 1000 of a method to disconnect a electronic component and a second electronic component according to an example. The first electronic component and the second electronic component are connected to a rack and connected to one another in an operational position. In block 1020, the lever is rotated between the third angular position and a second angular position. Rotation of the lever moves the drive pin along the guide structure and a reverse hook member engages with a rail unit connected to the second electronic component. The reverse hook member moves the rail unit along the first axis between the second rail position and the first rail position. Movement of the rail unit to return a spring member to an equilibrium state and separate the first electronic component and the second electronic component along the second axis.

The lever continues to rotate between a second angular position and a first angular position, in block 1040. Rotation of the lever moves the drive pin along the guide structure, which moves the first electronic component from a second longitudinal position to a first longitudinal position along the first axis. In the first longitudinal position, the first electronic component may be removed from the rack.

Although the flow diagrams 900 and 1000 of FIGS. 9-10 illustrate specific orders of execution, the order of execution may differ from that which is illustrated. For example, the order of execution of the blocks may be scrambled relative to the order shown. Also, the blocks shown in succession may be executed concurrently or with partial concurrence. All such variations are within the scope of the present invention.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art, Therefore, the scope of the present disclosure is limited only by the elements and limitations as used in the claims.

What is claimed is:

1. An assembly to connect a first and a second electronic component, the assembly comprising:
    a lever unit including:
        a lever including a primary cam member and a secondary cam member connected thereto and a hook member extending therefrom, the primary cam member, the secondary cam member, and the hook member to rotate with the lever; and
        a base connected to a first electronic component, the base includes a limiter to control movement of the first electronic component along a first axis,
        rotation of the lever to move the first electronic component along a y-axis towards a backplane until the primary cam member engages with a fixed pin and stops rotating, the secondary cam member to control movement along a second axis, the hook member to engage with a second electronic component and mate the first electronic component and the second electronic component along the second axis.

2. The assembly of claim 1, wherein the secondary cam member comprises guide structure formed to engage with a drive pin to control movement of at least one electronic component selected from the first electronic component and the second electronic component along the second axis.

3. The assembly of claim 1, wherein the first electronic component comprises an electronic module and the second electronic component comprises a thermal module,
    as the lever rotates between a first angular position and a second angular position, the drive pin moves along the guide structure, which moves the electronic module from a first longitudinal position to a second longitudinal position along the first axis; and
    as the lever rotates between the second angular position and a third angular position, the fixed pin prevents movement of the primary cam member, the drive pin moves along the guide structure and the hook member engages with a rail unit connected to the second electronic module, the hook member moves the rail unit along the y-axis between a first rail position and a second rail position, movement of the rail unit to mate the first electronic component and the second electronic component along the second axis.

4. The assembly of claim 3, wherein in the second angular position, an electrical connection forms between the electronic module and the backplane;

and in the third angular position, a thermal connection forms between the thermal module and the electronic module.

5. The assembly of claim 1, wherein the limiter comprises a pair of clutch plates and a limiter spring between the pair of clutch plates, the lever to displace the limiter spring after the primary cam member engages with the fixed pin.

6. The assembly of claim 5, wherein the rail unit comprises:
   a guide member including a flange and a guide rail, the hook member to engage with the flange to move the guide rail along a first axis; and
   an engagement member including a spring member and an engagement mechanism, the spring member to control the mating of at least one electronic component selected from the first electronic component and the second electronic component along a second axis using a spring force, the engagement mechanism connected to the spring member, the engagement mechanism to move along the guide rail, movement of the guide rail to displace the rail unit and mate the first electronic component and the second electronic component along the second axis.

7. The assembly of claim 6, wherein the engagement mechanism further comprises a roller.

8. The assembly of claim 6, wherein the spring member comprises a cantilever spring.

9. A system to connect an electronic module and a thermal module, the system comprising:
   an electronic module to perform computing operations;
   a lever unit including:
      a lever including a primary cam member and a secondary cam member connected thereto and a hook member extending therefrom, the primary cam member, the secondary cam member, and the hook member to rotate with the lever,
      a base connected to the electronic module, the base includes a guide structure to engage with a drive pin, rotation of the lever to move electronic module along a y-axis towards a backplane until a fixed pin restricts rotation of the primary cam member, the secondary cam member to move the drive pin along the guide structure, the hook member to engage with a thermal module and mate the electronic module and the thermal module along the second axis:
   the thermal module to remove heat from the electronic module; and
   a rail unit including:
      a guide member including a flange and a guide rail, the hook member to engage with the flange to move the guide rail along a first axis, and
      an engagement member including a spring member to control the mating of at least one electronic component selected from the electronic module and the thermal module along a second axis using a spring force, the engagement member to move along the guide rail, movement of the guide rail to displace the rail unit and to maintain the mating of the electronic module and the thermal module along the second axis and to form a thermal connection therebetween.

10. The system of claim 9, wherein the lever unit connects to the electronic module and the rail unit connects to the thermal module.

11. The system of claim 9, wherein the thermal nodule moves towards the electronic module to mate.

12. The system of claim 9, wherein the electronic module moves towards he thermal module to mate.

13. The system of claim 9, further comprising the engagement mechanism including the spring member formed therebetween, the spring member to provide a mating force between the engagement mechanism and the guide rail, the guide rail to displace the spring member to enable movement along the second axis.

14. The system of claim 9, further comprising an engagement mechanism connected to the spring member, the engagement mechanism to engage with the guide rail as the lever rotates.

15. A method to connect a first electronic component and a second electronic component, the method comprising:
   providing a lever unit and a rail unit to engage with one another,
      the lever unit includes:
         a lever including a primary cam member and a secondary cam member connected thereto and a hook member extending therefrom, the primary cam member, the secondary cam member, and the hook member to rotate with the lever, and
         a base connected to a first electronic component, the base includes a guide structure to engage with a drive pin; and
      the rail unit includes:
         a guide member including a flange and a guide rail, the hook member to engage with the flange to move the guide rail along a first axis, and
         an engagement member including a spring member to control the mating of at least one electronic component selected from the first electronic component and the second electronic component along a second axis using a spring force, the engagement member to move along the guide rail, movement of the guide rail to displace the rails unit and enable the first electronic component and the second electronic component to mate along the second axis and to form a thermal connection therebetween,
   rotating the lever between a first angular position and a second angular position, rotation of the lever moves the drive pin along the guide structure, which moves the first electronic component from a first longitudinal position to a second longitudinal position along the first axis, and
   rotating the lever between the second angular position and a third angular position, rotation of the lever moves the drive pin along the guide structure and the hook member engages with a rail unit connected to the second electronic component, the hook member moves the rail unit along the first axis between a first rail position and a second rail position, movement of the rail unit to mate the first electronic component and the second electronic component along the second axis.

* * * * *